(12) United States Patent
Liu et al.

(10) Patent No.: US 6,491,178 B1
(45) Date of Patent: Dec. 10, 2002

(54) UPPER COVER PLATE FOR AN AIR-TIGHT CHAMBER AND A TOOL FOR REMOVING THE SAME

(75) Inventors: Philip Liu, Hsinchu (TW); Tony Lee, Sanchung (TW); Wentchen Lee, Kaohsiung (TW); Andrew Cheng, Hsinchu (TW)

(73) Assignee: Mosel Vitelic Inc., Hsinchu (TW)

( * ) Notice: Subject to any disclaimer, the term of this patent is extended or adjusted under 35 U.S.C. 154(b) by 94 days.

(21) Appl. No.: 09/711,926

(22) Filed: Nov. 15, 2000

(30) Foreign Application Priority Data

Aug. 18, 2000 (TW) ........................................ 89214391 U

(51) Int. Cl.⁷ .............................................. B65D 43/26
(52) U.S. Cl. ........................... 220/284; 81/3.15; 81/3.55
(58) Field of Search ................................. 220/284, 285; 81/3.15, 3.55

(56) References Cited

U.S. PATENT DOCUMENTS

| | | | | |
|---|---|---|---|---|
| 633,653 A | * | 9/1899 | MacDonald | 220/285 |
| 739,406 A | * | 9/1903 | Fearis | 220/285 |
| 1,256,883 A | * | 2/1918 | Drysdale | 81/3.55 |
| 1,578,144 A | * | 3/1926 | Lee et al. | 220/285 |
| 1,666,366 A | * | 4/1928 | Cereghino | 220/284 |
| 4,932,554 A | * | 6/1990 | Smith et al. | 220/285 |

* cited by examiner

*Primary Examiner*—Nathan J. Newhouse
(74) *Attorney, Agent, or Firm*—Troxell Law Office PLLC

(57) ABSTRACT

An upper cover plate for an air-tight chamber and a tool for removing the upper cover plate from the chamber are introduced. The upper cover plate integrates a chamber body to form the air-tight chamber, in which the chamber body further includes a top surface for air-tightly matching with a bottom surface of the upper cover plate. The upper cover plate further includes a plurality of thread holes engageable respectively with a plurality of the tools. The present invention is characterized on that at least one of the thread holes is formed as a through thread hole connecting to the bottom surface, and that the respective tool for engaging with the through thread hole includes a portion for penetrating the through thread hole and going beyond the bottom surface. By providing the present invention, the top surface of the chamber body can be utilized as a pivotal plane for the tool to easily perform a helical lifting application upon the upper cover plate through the engaged threads, so that the air-tight state of the chamber can be easily removed.

7 Claims, 4 Drawing Sheets

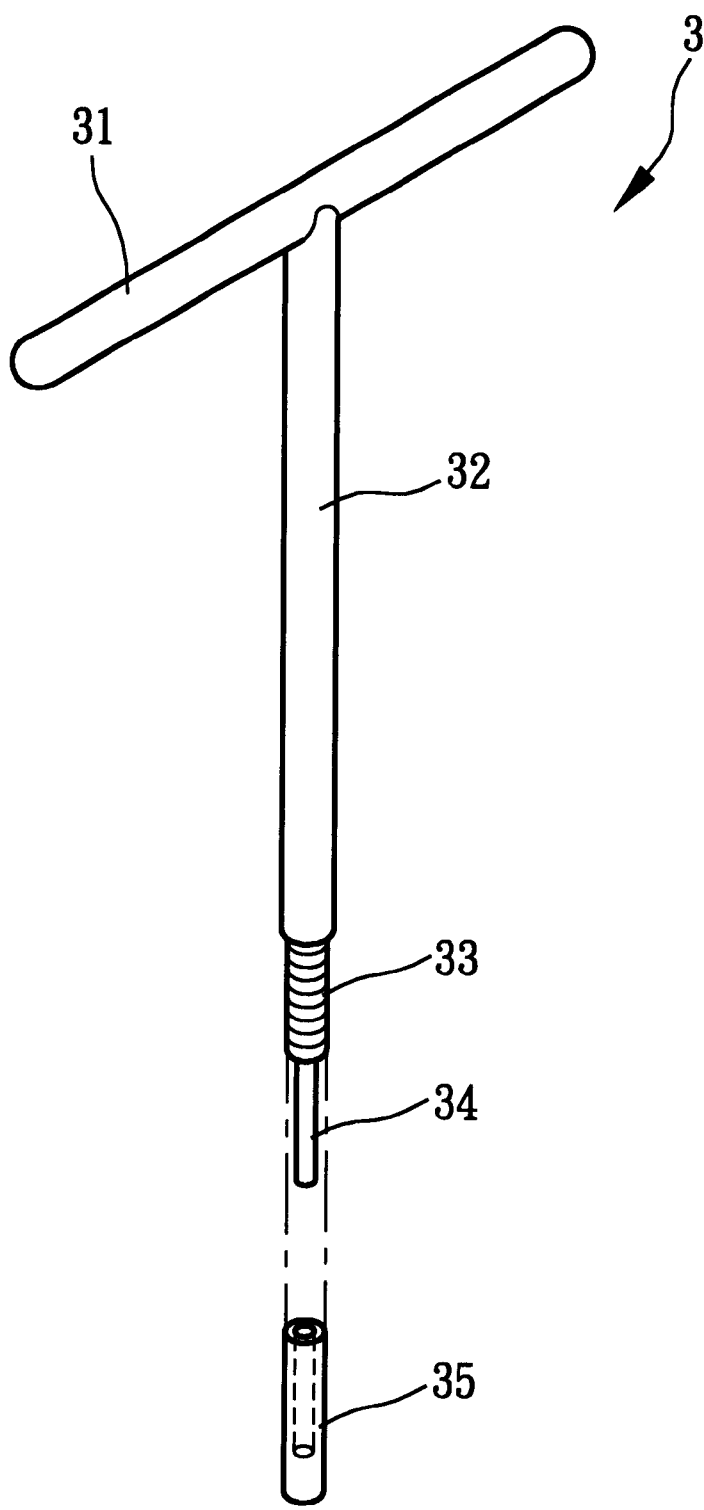
F I G . 4

UPPER COVER PLATE FOR AN AIR-TIGHT CHAMBER AND A TOOL FOR REMOVING THE SAME

BACKGROUND OF THE INVENTION

(1) Field of the Invention

The invention relates to an upper cover plate for an air-tight chamber and a tool for removing the upper cover plate, and more particularly to a plate structure and an accompanying tool which can make easier the breaking of the air-tight state of the chamber.

(2) Description of the Prior Art

Air-tight chambers are widely used in precision manufacturing. For example, in an electronic or a semiconductor industry, various types of air-tight chambers have been seen in a wafer-manufacturing process or the like. Conventionally, a middle-size or a large-size air-tight chamber is usually equipped with an automatic or a labor-saving mechanism for controlling opening/closing of a heavier air-tight door structure. However, due to a consideration of cost, a small-size air-tight chamber usually applies only a simple-structured cover plate for sealing the chamber. The opening, of the cover plate, i.e. the breaking of the air-tight or vacuum state of the chamber, is generally performed by utilizing a hand tool upon the cover plate.

Referring now to FIG. 1, a schematic side view of a typical air-tight chamber, say an Applied Eudura5500 PVD chamber, is shown. In this structure, the air-tight chamber includes a chamber body 1 and an upper cover plate 2. A top surface 13 of the chamber body 1 includes a annual groove 11 for accommodating an oil seal 12. A bottom surface 22 of the upper cover plate 2 is used to air-tightly mount upon the top surface 13 of the chamber body 1. By providing a plurality of screws (not shown in the figure), the upper cover plate 2 can be fastened onto the chamber body 1. At the same time, the oil seal 12 in the annual groove 11 can then be depressed and deformed in between to form an air-tight state of the chamber.

While beginning to disassemble the upper cover plate 2 from the chamber body 1, the screws in between need to be loosen firstly. At this time, due to the sealing effect provided by the oil seal 12, the upper cover plate 2 and the chamber body 1 are actually still integrated as an air-tight chamber. By applying substantial force upon a plurality of T-shaped tools 3 (2 shown in FIG. 1) engaged with the upper cover plate 2, the upper cover plate 2 then can be removed off the chamber body 1. During the removing of the upper cover plate 2, the air-tight state of the chamber is broken as soon as the oil seal 12 miss-contacts any of the upper cover plate 2 or the chamber body 1.

Referring now to FIG. 2, a conventional T-shaped tool 3 is shown perspective. The tool 3 includes a hand bar 31 for manual forcing operation, a stem bar 32 perpendicular to the hand bar 31, and an external thread part 33 formed at a free end of the stem bar 32. Please now refer back to FIG. 1. While applying the tool 3, each tool 3 is engaged directly with a respective blind thread hole 21 on the upper cover plate 2. Then, apply a lift to each tool 3 for separating the upper cover plate 2 from the chamber body 1; thus, the air-tight state of the chamber can be broken.

In the aforesaid chamber structure, it is obvious that the thread holes for fastening the upper cover plate 2 to the chamber body 1 and the blind thread holes 21 for engaging with the T-shaped tool 3 are all located outsides to the annual groove 11. On the other hand, the air-tight interior of the chamber is formed insides to the annual groove 11. Upon such an arrangement, the air-tight state of the chamber can be established by depressing the oil seal 12 located in the annual groove 11.

Apparently, in the application of the upper cover plate 2 and the T-shaped tool 3, a substantial lifting force is required directly to break the air-tight state of the chamber. Thus, a so-called hard-pulling mechanism is formed. Nevertheless, in practice, only limited room around the chamber is available for manual lifting operation of the T-shaped tool 3. Actually, in the example of the Applied Eudura 5500 PVD chamber, the disassembly of the chamber upon breaking the air-tight state is usually so difficult that substantial labor and time are required while carrying out a periodical or an urgent maintenance.

SUMMARY OF THE INVENTION

Accordingly, it is a primary object of the present invention to provide an upper cover plate for an air-tight chamber and a tool for removing the upper cover plate from the chamber, in which a top surface of a chamber body of the air-tight chamber can be utilized as a pivotal plane for the tool to easily perform a helical lifting application upon the upper cover plate through engaged threads, and thereby the air-tight state of the chamber can be easily removed.

The upper cover plate for an air-tight chamber is introduced to integrate a chamber body for forming the air-tight chamber, in which the chamber body provides a top surface to air-tightly match with a bottom surface of the upper cover plate. The upper cover plate further includes a plurality of thread holes engageable respectively with a plurality of the tools. The present invention is characterized on that at least one of the thread holes is formed as a through thread hole connecting to the bottom surface, and that the respective tool for engaging with the through thread hole includes a portion for penetrating the through thread hole and going beyond the bottom surface.

In the present invention, at least one of the thread holes should be formed as the through thread hole for engaging with the tool of the present invention, and the rest of the thread holes can be made as the conventional blind thread holes as described above in the background section. In accordance with the present invention, all of the thread holes can be formed as the through thread holes.

In the present invention, the tool for engaging with the through thread hole includes a hand bar, a stem bar and a thread part. The hand bar is used to receive an external torque for driving the tool helically along the through thread hole. The stem bar has two ends for fixedly connecting with the hand bar and the thread part, respectively. The thread part includes exterior threads for engaging with respective interior threads of the through thread hole. By providing the present invention, while the tool is applied to the through thread hole, the torque can be applied to the hand bar for rotating the thread part feeding along the through thread hole. As long as the thread part of the tool goes beyond the through thread hole of the upper cover plate and touches with the top surface of the chamber body, the top surface can be deemed as a pivot plane for the tool to rotate about the stem bar. Thus, further rotation of the tool can generate a lifting force contributed by the sliding threads between the thread part and the through thread hole for easily elevating the upper cover plate off the chamber body. Therefore, the air-tight state of the chamber can be easily broken.

In one embodiment of the present invention, the hand bar of the tool is preferably perpendicular to the stem bar.

In one embodiment of the present invention, the thread part further includes an extended portion for playing as the portion to go beyond the bottom surface of the upper cover plate.

In one embodiment of the present invention, the extended portion of the tool can further include a friction sleeve for wrapping around the exterior of the extended portion, by which the top surface of the chamber can be prevented from being scratched upon the tool rotating thereon. Preferably, the friction sleeve can be made of a Teflon material.

All these objects are achieved by the upper plate and the tool described below.

BRIEF DESCRIPTION OF THE DRAWINGS

The present invention will now be specified with reference to its preferred embodiment illustrated in the drawings, in which

FIG. 4 is an exploded perspective view of the tool in accordance with the present invention.

DESCRIPTION OF THE PREFERRED EMBODIMENT

The invention disclosed herein is directed to an upper cover plate for an air-tight chamber and a tool for removing the upper cover plate from the air-tight chamber. In the following description, numerous details are set forth in order to provide a thorough understanding of the present invention. It will be appreciated by one skilled in the art that variations of these specific details are possible while still achieving the results of the present invention. In other instance, well-known components are not described in detail in order not to unnecessarily obscure the present invention.

In the following description, parts with alike function will be identically named and numerated for simplifying the explanation of the present invention.

Figure 3:
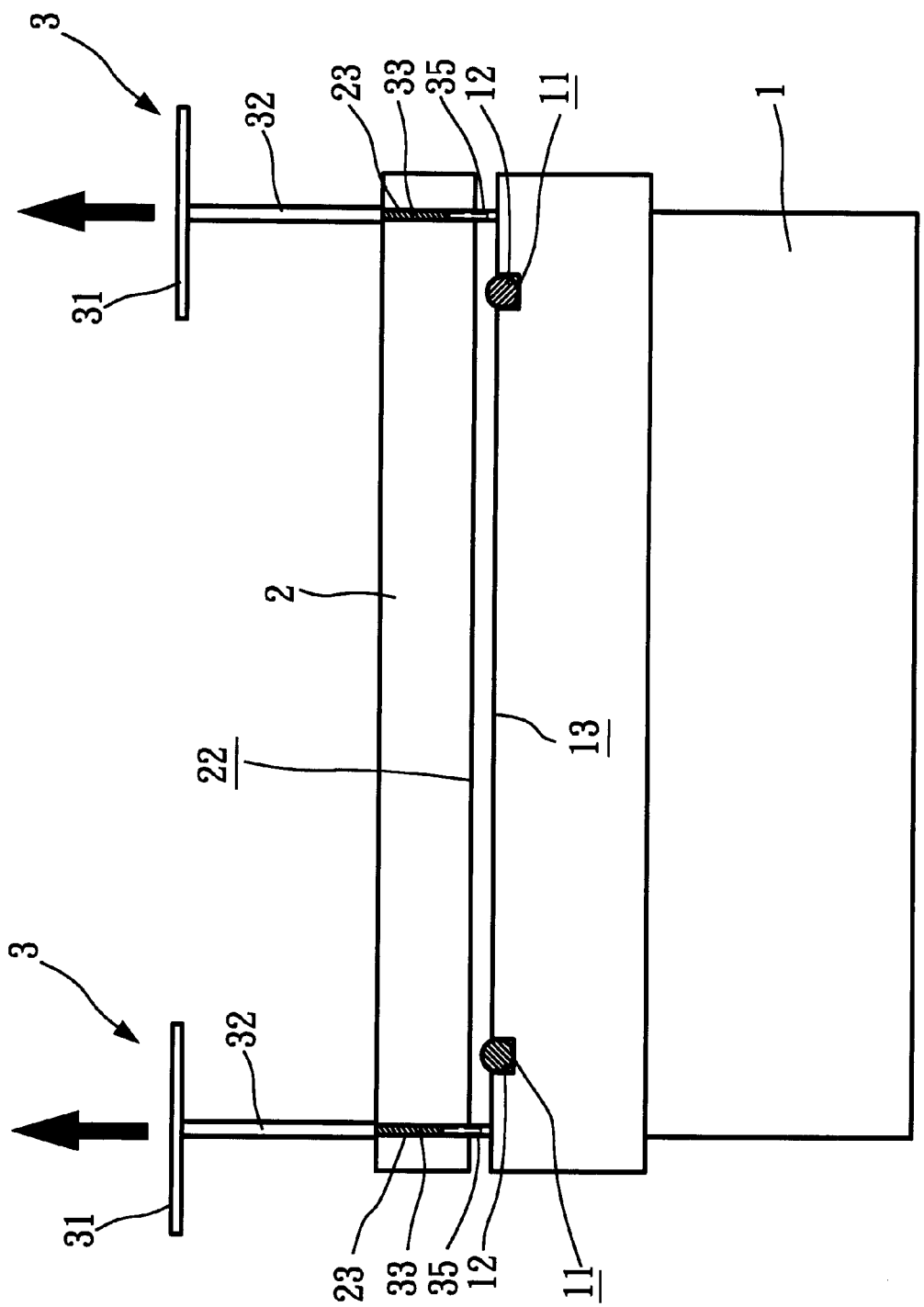
FIG. 3 is a schematic view for showing the tools of the present invention to remove the upper cover plate of the present invention from the chamber body.

Referring now to FIG. 3 and FIG. 4, the structure and the operation of the upper cover plate 2 and the accompanying tool 3 in accordance with the present invention are shown.

As shown, the upper cover plate 2 for the air-tight chamber of the present invention is introduced to integrate the chamber body 1 for forming the air-tight chamber. The chamber body 1 as described above provides a top surface 13 for air-tightly matching with a bottom surface 22 of the upper cover plate 2. The upper cover plate 2 further includes a plurality of thread holes engageable respectively with a plurality of the tools 3. The present invention is characterized on that at least one of the thread holes is formed as a through thread hole 23 connecting to the bottom surface 22, and that the respective tool 3 for engaging with the through thread hole 23 includes a portion for penetrating the through thread hole 23 and going beyond the bottom surface 22 as shown in FIG. 3. In FIG. 3, two through thread holes 23 accompanying respectively two tools 3 of the present invention are shown.

Figure 1:
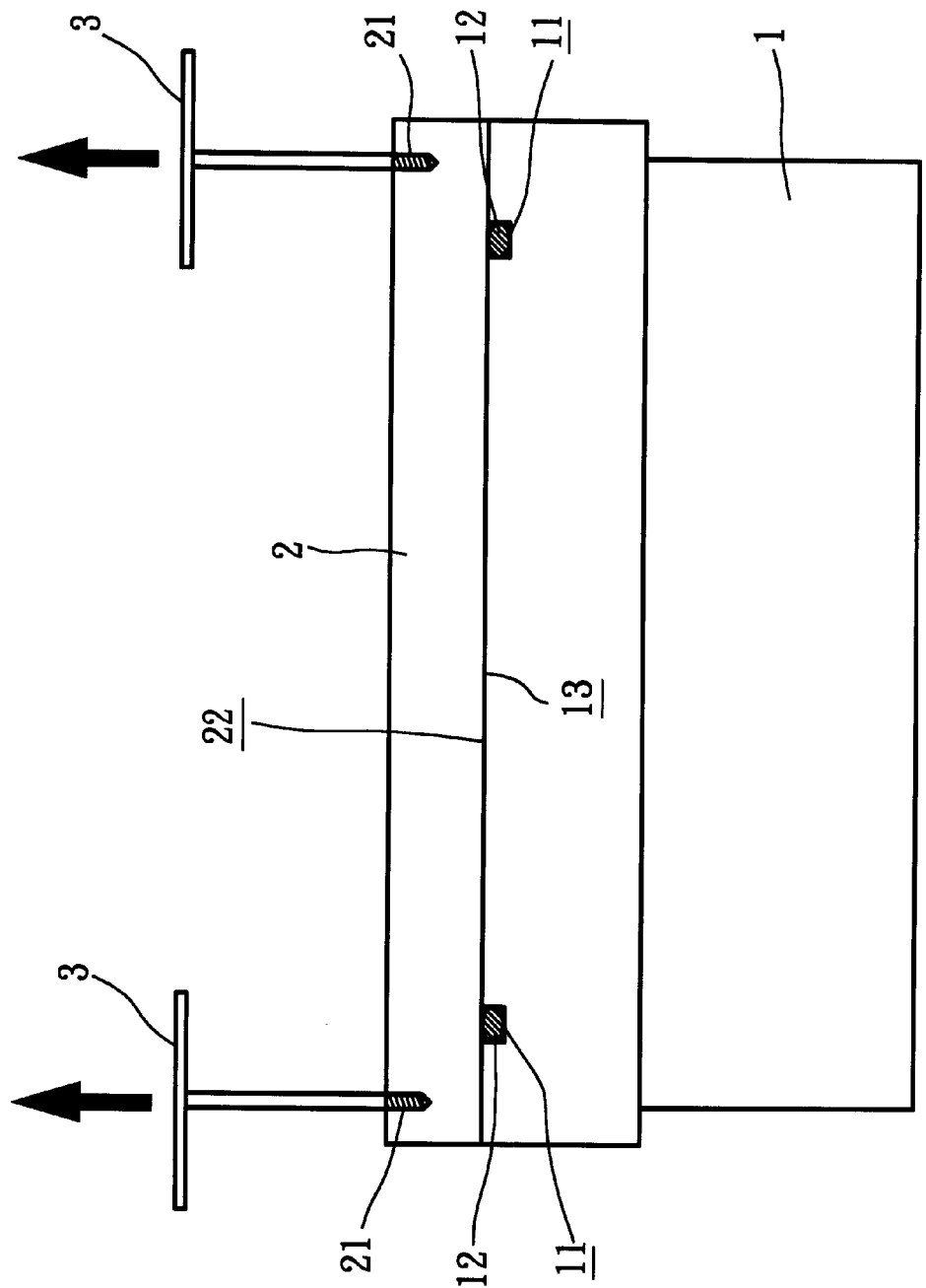
FIG. 1 is a schematic side view of a conventional air-tight chamber and conventional tools for removing the upper cover plate.
Figure 2:
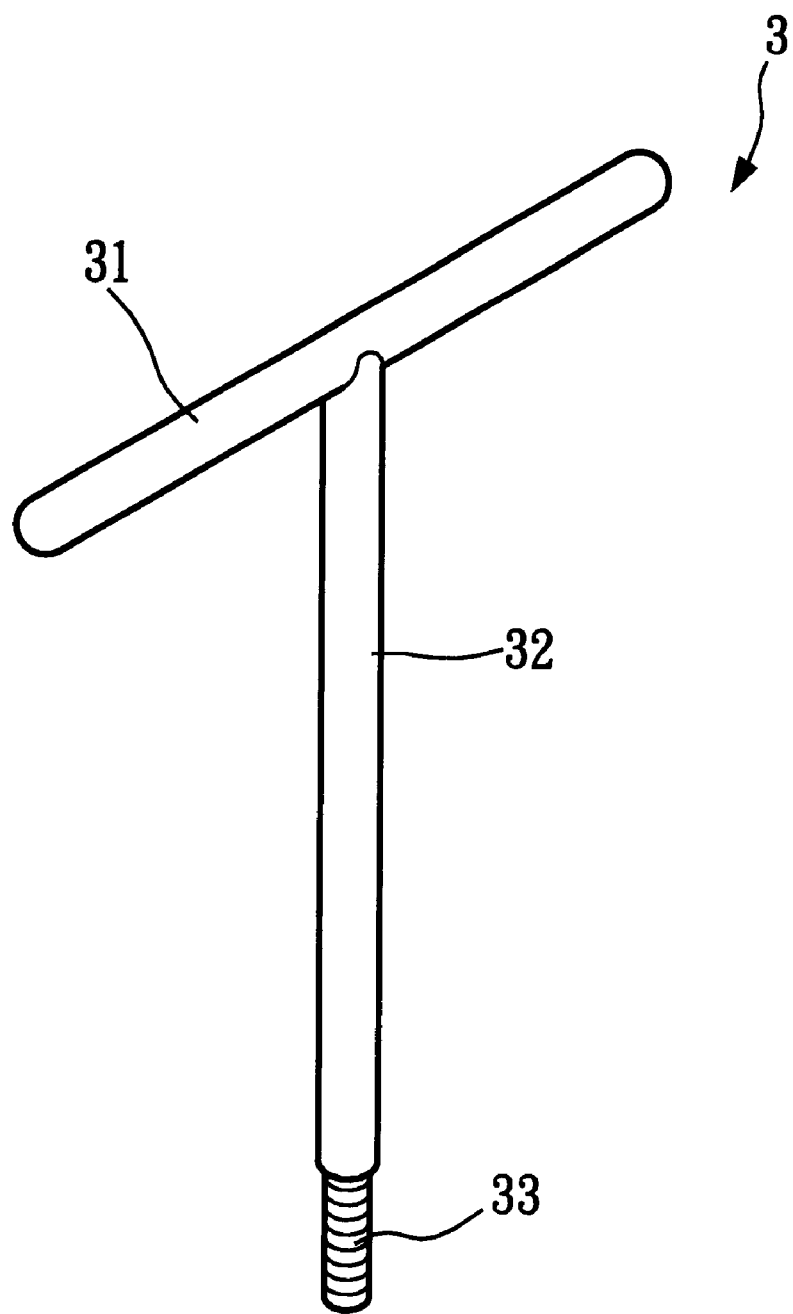
FIG. 2 is a perspective view of the conventional tool of FIG. 1.

In the present invention, at least one of the thread holes should be formed as the through thread hole 23 for engaging with the tool 3 of the present invention, and the rest of the thread holes can be made as the conventional blind thread holes 21 for engaging with the conventional tools 3 as described above in the background section (FIG. 1). In accordance with the present invention, it is also one of the several embodiments that all of the thread holes are structured as the through thread holes 23.

In the present invention, the tool 3 for engaging with the through thread hole 23 can include a hand bar 31, a stem bar 32 and a thread part 33. The hand bar 31 is used to receive an external torque for driving the tool 3 helically along the through thread hole 23. The stem bar 32 as a rotation axis for the hand bar 31 has two ends for fixedly connecting with the hand bar 31 and the thread part 33, respectively. The thread part 33 includes exterior threads for engaging with respective interior threads of the through thread hole 23. As shown in FIG. 4, the hand bar 31, the stem bar 32 and the thread part 33 are preferably formed as a single piece. However, in other embodiments not shown here, the tool 3 can be a structure with removable parts.

Refer to FIG. 3. While the tool 3 of the present invention is applied to the through thread hole 23, the torque can be applied directly to the hand bar 31, through the stem bar 32, and further to rotate the thread part 33 feeding insides along the through thread hole 23. As long as the thread part 33 of the tool 3 keeps feeding and goes beyond the through thread hole 23 (also beyond the bottom surface 22 ) of the upper cover plate 2 to further touch with the top surface 13 of the chamber body 1, the top surface 13 can then be deemed as a pivot plane for the tool 3 to rotate thereupon about the stem bar 32 as well as the through thread hole 23. Thus, further rotation of the tool 3 can generate a lifting force contributed by the sliding threads between the thread part 33 and the through thread hole 23 for easily elevating the upper cover plate 2 off the chamber body 1. Therefore, the air-tight state of the chamber can be easily broken.

In the preferred embodiment of the present invention, the hand bar 31 of the tool 3 is preferably perpendicular to the stem bar 32, so that a T-shape structure can be obtained. Also, in other embodiments of the present invention (not shown in figures), the hand bar 31 and the stem bar 32 of the tool 3 can be connected to form a Y-shape structure, a inverse L-shape structure, or any the like.

In the preferred embodiment of the present invention shown in FIG. 4, a free end of the thread part 33 can further include an extended portion 34 for playing as the portion to go beyond the bottom surface 22 of the upper cover plate 2. While the thread part 33 of the tool 3 is kept feeding inside the through thread hole 23, the extended portion 34 is used to go beyond the bottom surface 22 of the upper cover plate 2 and is used to contact upon the top surface 13 of the chamber body 1. The extended portion 34 can be simply structured as a pure extension of the thread part 33. In another embodiment of the present invention (not shown in figures), the extended part 34 can also be formed as an unthreaded portion extended from the free end of the thread part 33. Definitely, the unthreaded portion should have a diameter not larger than the diameter for the thread part 33.

As shown in the preferred embodiment of the tool 3 in accordance with the present invention, the extended portion 34 can further include a friction sleeve 35 for wrapping around the exterior of the extended portion 34. By providing the friction sleeve 35, the top surface 13 of the chamber body 1 can be prevented from any scratch while the tool 3 rotating thereupon. Preferably, the friction sleeve 35 can be made of a Teflon material. In other embodiments of the present invention, relevant material for the friction sleeve 35 can be copper, plastic, or any the like.

In the present invention, the outer diameter for the combination of the friction sleeve 35 and the extended part 34 should be no more than the diameter of the thread part 33. Thereby, the combination of the friction sleeve 35 and the extended part 34 can go through the through thread hole 23, extend over the bottom surface 22 of the upper cover plate 2, and pivot upon the top surface 13 of the chamber body 1.

According to the present invention, it is meaningful and contributed that a portion of the tool 3, i.e. the free end of the thread part 33 thereof, can extend over the bottom surface 22 of the upper cover plate 2 and pivot upon the top surface 13 of the chamber body 1. Upon an operation of removing the air-tight state of the chamber, while the tool 3 penetrating the upper cover plate 2 provides the extended part 34 to contact with or pivot upon the top surface 13 of the chamber body 1, the contact point can be well deemed as a pivotal point for the tool 3 to rotate around. When the tool 3 rotates around the pivotal point (so as the stem bar 32, the thread part 33 and the through thread hole 23), the upper cover plate 2 can be seen as a block sliding along the stem bar 32 and the thread part 33 of the tool 3. Upon such an arrangement, a mechanism of a screw bar (i.e. the tool 3) and a sliding block (i.e. the upper cover plate 2) is formed. In the mechanism, the hand bar 31 of the tool 3 is the input and the upper cover plate 2 is the output. By providing a torque to the hand bar 31 while the extended part 34 going over the bottom surface 22 of the upper cover plate 2, the upper cover plate 2 can then be easily lifted, so that the air-tight state of the chamber can be broken. It is obvious that, by compared with the hard-pulling mechanism in the conventional design, a labor-saving screw-and-block mechanism is introduced in the present invention for breaking or removing the air-tight state of the chamber.

The differences between the upper cover plate 2 as well as the tool 3 of the present invention and that of the prior art are listed in Table 1. As shown, it is for sure that substantial improvement over the prior art has been made to the present invention. The apparent advantage from the present invention is the inclusion of the labor-saving screw-and-sliding block mechanism formed by the tool 3 (as the screw bar), the upper cover plate 2 (as the sliding block) and the chamber body 1 (for providing the top surface 13 to locate the pivot point). By providing such a mechanism, difficulty for lifting the upper cover plate 2 from the air-tight state of the chamber can be substantially reduced.

While the present invention has been particularly shown and described with reference to a preferred embodiment, it will be understood by those skilled in the art that various changes in form and detail may be without departing from the spirit and scope of the present invention.

TABLE 1

Comparison upon the upper cover plate and the tool between the present invention and the prior art

|  | Prior art | Present invention |
| --- | --- | --- |
| Upper cover plate | Including only the thread blind hole for accompanying with the tool | Including at least a through thread hole for accompanying with the tool |
| Tool | Including a thread part no way to penetrate the thread blind hole | Including a thread part providing an extended part to penetrate the through thread hole |
| Mechanism for removing the air-tight state | Hard-pulling mechanism | Screw-and-sliding block mechanism |

We claim:

1. An upper cover plate for an air-tight chamber, for engaging a chamber body to form the air-tight chamber, the chamber body including a top surface for matching with a bottom surface of the upper cover plate, further including a plurality of thread holes engageable respectively with a plurality of tools, and characterized in that: at least one of the plurality of thread holes is formed as a through thread hole connecting to the bottom surface, and the respective tool for engaging with the through thread hole includes a portion thereof for penetrating the through thread hole and going beyond the bottom surface, wherein said tool for engaging with said through thread hole includes:

a hand bar, for receiving a torque to drive said tool helically along said through thread hole;

a stem bar, formed as a rotation axis for the hand bar, having thereof a first end connecting fixedly with the hand bar; and a thread part, fixedly connecting with a second end of the stem bar, engageable with said through thread hole;

wherein while said tool is being applied to said through thread hole, the torque is applied to the hand bar to rotate the thread part feeding along said through thread hole until a portion of the thread part goes beyond said bottom surface of said upper cover plate, wherein said thread part further includes an extended portion for going beyond said bottom surface of said upper cover plate, said extended portion further including a friction sleeve wrapping an exterior thereof.

2. The upper cover plate for an air-tight chamber according to claim 1, wherein said thread holes are all formed as through thread holes.

3. The upper cover plate for an air-tight chamber according to claim 1, wherein said hand bar is perpendicular to said stem bar.

4. The upper cover plate for an air-tight chamber according to claim 1, wherein said friction sleeve is made of a polytetrafluoroethylene material.

5. A tool for removing an upper cover plate from a chamber body of an air-tight chamber, the upper cover plate further including at least a thread hole engageable with the tool, the thread hole formed as a through thread hole connecting to a bottom surface of the upper cover plate, comprising:

a hand bar, for receiving a torque to drive the tool helically along the through thread hole;

a stem bar, formed as a rotation axis for the hand bar, having thereof a first end connecting fixedly with the hand bar;

a thread part, fixedly connecting with a second end of the stem bar, engageable with the through thread hole; and an extended part, connecting with the thread part, having an outer diameter thereof smaller than an outer diameter of the thread part;

wherein said extended part further includes a friction sleeve wrapping an exterior thereof.

6. The tool according to claim 5, wherein said hand bar is perpendicular to said stem bar.

7. The tool according to claim 5, wherein said friction sleeve is made of a polytetrafluoroethylene material.

* * * * *